(12) United States Patent
Kimura et al.

(10) Patent No.: US 11,415,536 B2
(45) Date of Patent: Aug. 16, 2022

(54) GAS SENSOR MODULE AND METHOD OF MANUFACTURING GAS SENSOR MODULE

(71) Applicant: Nissha Co., Ltd., Kyoto (JP)

(72) Inventors: Teppei Kimura, Kyoto (JP); Hiroaki Suzuki, Kyoto (JP)

(73) Assignee: Nissha Co., Ltd., Kanagawa (JP)

( * ) Notice: Subject to any disclaimer, the term of this patent is extended or adjusted under 35 U.S.C. 154(b) by 713 days.

(21) Appl. No.: 16/472,134

(22) PCT Filed: Nov. 6, 2017

(86) PCT No.: PCT/JP2017/039870
§ 371 (c)(1),
(2) Date: Jun. 20, 2019

(87) PCT Pub. No.: WO2018/116663
PCT Pub. Date: Jun. 28, 2018

(65) Prior Publication Data
US 2019/0383761 A1 Dec. 19, 2019

(30) Foreign Application Priority Data

Dec. 20, 2016 (JP) .............................. JP2016-246958

(51) Int. Cl.
*G01N 27/12* (2006.01)
*H01L 21/48* (2006.01)
(Continued)

(52) U.S. Cl.
CPC ......... *G01N 27/12* (2013.01); *H01L 21/4817* (2013.01); *H01L 21/52* (2013.01);
(Continued)

(58) Field of Classification Search
CPC ...... G01N 27/12; H01L 21/4817; H01L 21/52; H01L 21/6836; H01L 21/784;
(Continued)

(56) References Cited

U.S. PATENT DOCUMENTS

2008/0283952 A1 11/2008 Choi et al.

FOREIGN PATENT DOCUMENTS

| CN | 101297404 | 10/2008 | |
| CN | 104458865 A * | 3/2015 | ......... G01N 33/0009 |

(Continued)

OTHER PUBLICATIONS

European Search Report for European Application No. 17884495.7 dated Oct. 21, 2019, 8 pages, Germany.

*Primary Examiner* — Jasmine J Clark
(74) *Attorney, Agent, or Firm* — Thorpe North & Western

(57) ABSTRACT

A package is configured such that a length in a direction parallel to a semiconductor chip is larger than a length in a direction orthogonal to the semiconductor chip, and the package includes a substrate to which the semiconductor chip is electrically connected and fixed, a side wall firmly attached to the substrate, and a cover firmly attached to the side wall. The package includes a detection space in which gas flows around the semiconductor chip. The package includes openings formed in the side wall and/or between the side wall and the cover and communicated with the detection space.

6 Claims, 29 Drawing Sheets

(51) Int. Cl.
  *H01L 21/52* (2006.01)
  *H01L 21/683* (2006.01)
  *H01L 21/784* (2006.01)
  *H01L 23/055* (2006.01)
  *H01L 23/00* (2006.01)

(52) U.S. Cl.
  CPC ........ *H01L 21/6836* (2013.01); *H01L 21/784* (2013.01); *H01L 23/055* (2013.01); *H01L 24/48* (2013.01); *H01L 24/85* (2013.01); *H01L 24/97* (2013.01); *H01L 2221/68327* (2013.01); *H01L 2224/48091* (2013.01); *H01L 2224/48106* (2013.01); *H01L 2224/48225* (2013.01); *H01L 2224/95001* (2013.01)

(58) Field of Classification Search
  CPC ....... H01L 23/055; H01L 24/48; H01L 24/85; H01L 24/97
  See application file for complete search history.

(56) References Cited

FOREIGN PATENT DOCUMENTS

| | | |
|---|---|---|
| JP | H05-069667 | 9/1993 |
| JP | H05-249057 | 9/1993 |
| JP | H07-239988 | 9/1995 |
| JP | 2004-177263 | 6/2004 |
| JP | 2008-026876 | 2/2008 |
| JP | 2011-237220 | 11/2011 |
| JP | 2012-051760 | 3/2012 |
| JP | 2012-078089 | 4/2012 |
| JP | 2012-122862 | 6/2012 |
| JP | 2012-517600 | 8/2012 |
| JP | 2014-070945 | 4/2014 |
| JP | 2014-081367 | 5/2014 |
| JP | 2014-092403 | 5/2014 |
| JP | 2015-129688 | 7/2015 |
| JP | 2016-536766 | 11/2016 |
| WO | WO 01/40784 | 6/2001 |

* cited by examiner

GAS SENSOR MODULE AND METHOD OF MANUFACTURING GAS SENSOR MODULE

TECHNICAL FIELD

The present technology relates to a gas sensor module and a method of manufacturing the gas sensor module and in particular relates to a gas sensor module including a semiconductor chip on which a gas sensor element is integrated and a method of manufacturing the gas sensor module.

BACKGROUND ART

A gas sensor module has been conventionally provided as an integrated device obtained by forming a three-dimensional shape on a semiconductor substrate by etching process or the like in order to detect gas. For example, Japan Unexamined Patent Publication No. 2014-81367 describes a gas sensor module including a gas sensor element formed of a heater and a sensitive membrane in a Micro Electro Mechanical System (MEMS) structure; and a case configured to house the gas sensor element.

The gas sensor module described in Japan Unexamined Patent Publication No. 2014-81367 has a flattened outer shape such that a length in a direction orthogonal to a semiconductor chip on which the gas sensor element is formed is less than a length in a direction parallel to the semiconductor chip. The gas sensor module downsized as in Japan Unexamined Patent Publication No. 2014-81367 is applicable to be mounted in a small space of various devices. If a space of a device in which the gas sensor module is mounted has substantially the same height as that of the gas sensor module, it may be difficult for gas to flow through an opening formed in an upper surface of the gas sensor module. When it is difficult for the gas to flow through the opening, the gas sensor module has difficulty in detecting the gas.

SUMMARY

The present technology provides a gas sensor module configured to easily detect gas even in a case where the gas sensor module is attached in a mounting space having a short length in a direction orthogonal to a semiconductor chip on which a gas sensor element is formed.

Some aspects are described below. These aspects can be combined in any manner as needed.

A gas sensor module according to an aspect of the present technology includes: a semiconductor chip on which a gas sensor element is formed; and a package with a flattened shape including a substrate to which the semiconductor chip is electrically connected and fixed, a side wall firmly attached to the substrate, and a cover firmly attached to the side wall, the package including a detection space in which gas flows around the semiconductor chip, the package having a length in a direction parallel to the semiconductor chip larger than a length in a direction orthogonal to the semiconductor chip. The package includes a plurality of openings formed in the side wall and/or between the side wall and the cover that communicate with the detection space.

In the gas sensor module according to the aspect above, at least one of the openings that communicate with the detection space allows gas from the outside to flow into the detection space and the rest of the openings allow the gas to be discharged. In addition, the openings are not closed by a housing that houses the gas sensor module, for example, even when the housing is brought into contact with an upper surface of the gas sensor module. Therefore, even when the gas sensor module is attached in a mounting space having a short length in a direction orthogonal to the semiconductor chip, the gas sensor module can easily detect gas.

In the foregoing gas sensor module, the package may include a plurality of openings that communicate with the detection space, the openings formed at least between the side wall and the cover, and the cover may have a thickness of from 0.01 mm to 2 mm. In the gas sensor module configured as just described, the thickness of the cover is 0.01 mm or greater; therefore, even when the gas sensor module is mounted in a narrow space in which the housing is in contact with an upper surface of the cover, gas can be guided through the openings to the detection space. Also, the thickness of the cover is 2 mm or less; therefore, for example, at the time of package dicing, a dicing tape is attached and foreign substances can be prevented from entering through the openings together with cooling water or the like. As a result, the gas sensor module is configured to increase the certainty of gas introduction into the detection space and improve quality when being mounted in a mounting space having a short length in a direction orthogonal to the semiconductor chip.

A gas sensor module according to another aspect of the present technology includes: a semiconductor chip to which a gas sensor element is formed; and a package with a flattened shape including a substrate on which the semiconductor chip is electrically connected and fixed, a side wall firmly attached to the substrate, and a cover firmly attached to the side wall, the package including a detection space in which gas flows around the semiconductor chip, the package having a length in a direction parallel to the semiconductor chip larger than a length in a direction orthogonal to the semiconductor chip. The package includes a plurality of openings that communicate with the detection space, the openings formed in the cover, and a protrusion for forming a passage through which gas is guided to the plurality of openings.

In the gas sensor module according to the aspect above, at least one of the openings that communicate with the detection space allows gas from the outside to flow into the detection space and the rest of the openings allow the gas to be discharged. In addition, the protrusion is provided; therefore, for example, even when the housing that houses the gas sensor module is brought into contact with an upper portion of the gas sensor module, the openings are not closed by the housing. Consequently, even when being attached in a mounting space having a short length in a direction orthogonal to the semiconductor chip, the gas sensor module can easily detect gas.

In the gas sensor module according to the foregoing aspect, the protrusion of the package may have a height of from 0.01 mm 2 mm. In the gas sensor module configured as just described, the height of the protrusion is 0.01 mm or greater; therefore, for example, even when the gas sensor module is mounted in a narrow space in which the housing is in contact with an upper portion of the cover, gas can be guided through the openings to the detection space. In addition, the height of the protrusion is 2 mm or less; therefore, for example, at the time of package dicing, the dicing tape is attached and foreign substances can be prevented from entering through the openings together with cooling water or the like. As a result, the gas sensor module is configured to increase the certainty of gas introduction into the detection space and improve quality when being mounted in a mounting space having a short length in a direction orthogonal to the semiconductor chip.

A method of manufacturing a gas sensor module according to an aspect of the present technology includes: forming a side wall forming member on a collective substrate or a cover forming member by injection molding such that the side wall forming member including a plurality of dents corresponding to a chip arrangement space surrounds a plurality of the chip arrangement spaces; fixing by die bonding a plurality of semiconductor chips, each of which is provided with a gas sensor element, in a plurality of areas of the collective substrate, which corresponds to the plurality of chip arrangement spaces, and electrically connecting the plurality of semiconductor chips by wire bonding to terminals of the collective substrate; assembling a gas sensor module by bonding the side wall forming member to the cover, the cover forming member, or the collective substrate; and separating the gas sensor modules formed on the collective substrate by dicing at least the side wall forming member and the collective substrate such that the plurality of dents are formed as openings that communicate with the chip arrangement space.

In the method of manufacturing a gas sensor module according to the aspect above, the dents are formed in the side wall forming member by injection molding. Therefore, even when the gas sensor module is configured such that a length in a direction orthogonal to the semiconductor chip is, for example, 3 mm or less, the openings can be easily formed in the side wall.

A method of manufacturing a gas sensor module according to another aspect of the present technology includes: forming a side wall forming member by injection molding on a collective substrate or a cover forming member such that the side wall forming member surrounds a plurality of chip arrangement spaces; fixing by die bonding a plurality of semiconductor chips, each of which is provided with a gas sensor element, in a plurality of areas of the collective substrate, which corresponds to the plurality of chip arrangement spaces, and electrically connecting the plurality of semiconductor chips by wire bonding to terminals of the collective substrate; assembling a plurality of gas sensor modules by bonding the side wall forming member such that a plurality of openings that communicate with the plurality of chip arrangement spaces are formed between covers and the side wall forming member, corresponding to the plurality of chip arrangement spaces; attaching a dicing tape to close the plurality of openings; and separating the plurality of gas sensor modules formed on the collective substrate by pouring coolant on a dicing blade while dicing at least the side wall forming member and the collective substrate by the dicing blade.

In the method of manufacturing a gas sensor module according to the aspect above, a gap is formed between the side wall forming member and the cover. Therefore, even when the gas sensor module is configured such that a length in a direction orthogonal to the semiconductor chip is, for example, 3 mm or less, the openings can be easily formed between the side wall and the cover. In addition, the coolant can be prevented by the dicing tape from entering the chip arrangement space.

A gas sensor module according to the present technology can easily detect gas even when being attached in a mounting space having a short length in a direction orthogonal to a semiconductor chip on which a gas sensor element is formed. In addition, a method of manufacturing a gas sensor module according to the present technology provides such a gas sensor module.

DETAILED DESCRIPTION

First Embodiment

A gas sensor module according to a first embodiment of the present technology will be described by using FIGS. 1 to 19.

(1) Configuration of Gas Sensor Module

Figure 1:
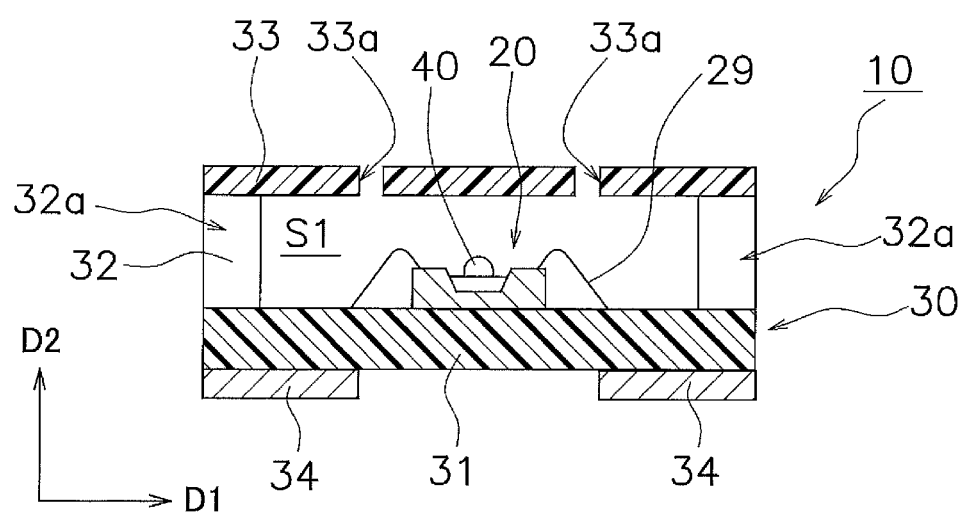
FIG. 1 is a schematic cross-sectional view of a gas sensor module according to a first embodiment.

The cross-sectional shape of a gas sensor module 10 according to the first embodiment is schematically illustrated in FIG. 1. The gas sensor module 10 according to the first embodiment includes a semiconductor chip 20 and a package 30.

A gas sensor element 40 is formed on the semiconductor chip 20.

The package 30 includes a substrate 31, a side wall 32, and a cover 33. The package 30 has, for example, a rectangular shape of 5 mm×5 mm or less in a plan view, and the height is 3 mm or less. The side wall 32 is firmly attached to the substrate 31. Firmly attaching the side wall 32 to the substrate 31 can be performed, for example, by injection-molding the side wall 32 on the substrate 31 as described below. Also, another method of firm attachment is, for example, a method of bonding the side wall 32 to the substrate 31 with an adhesive, for example.

The semiconductor chip 20 is fixed to the substrate 31 with an adhesive, for example. The cover 33 is firmly attached to the side wall 32. Firmly attaching the cover 33 to the side wall 32 can be performed, for example, by bonding the cover 33 to the side wall 32 with an adhesive. Also, another method of firm attachment is, for example, a method of injection-molding the side wall 32 on the cover 33.

Terminals 34 are provided on a bottom portion of the package 30. The package 30 is a non-lead package. The terminals 34 are connected to an external circuit, and whereby the gas sensor module 10 is electrically connected to the external circuit. For example, the terminals 34 and the semiconductor chip 20 are electrically connected, for example, by bonded wires 29.

The package 30 is formed in a flattened shape such that a length in a horizontal direction D1 to the semiconductor chip 20 is larger than a length in an orthogonal direction D2 to the semiconductor chip 20. The package 30 integrally includes a detection space S1 in which gas flows around the semiconductor chip 20. The package 30 is configured such that two openings 32a that communicate with the detection space S1 are disposed in the side wall 32. Further, the package 30 is configured such that two openings 33a that communicate with the detection space S1 are disposed in the cover 33. The size of each of the openings 33a is such that, for example, a length in the horizontal direction D1 is from 0.1 mm to 0.5 mm. The area of each of the openings 32a, 33a is, for example, from 0.001 mm$^2$ to 0.2 mm$^2$.

(2) Type of Use of Gas Sensor Module

For example, in a case where the gas sensor module 10 illustrated in FIG. 1 includes the gas sensor element 40 for detecting a specific type of gas, the gas sensor module 10 is configured to detect whether such a specific kind of gas exists in the gas flowing into the detection space S1. A device in which the gas sensor module 10 as just described is mounted may include, for example, a gas alarm, an alcohol checker, an automobile, a medical device, an air conditioner, and various measuring instruments.

Figure 2:
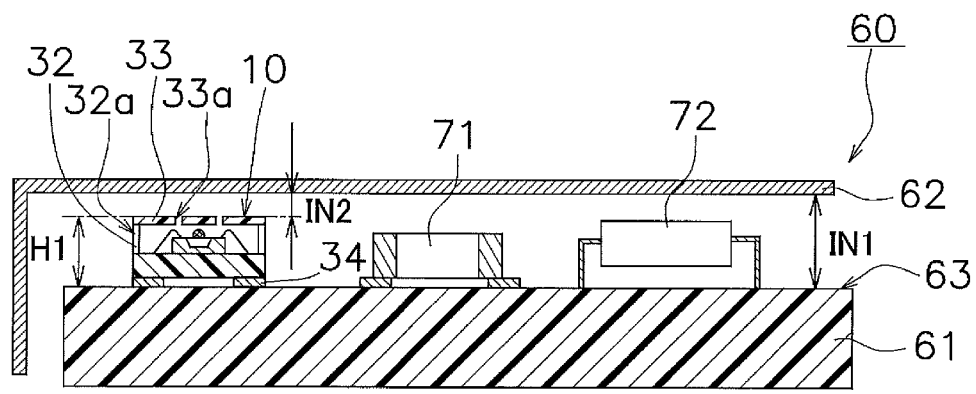
FIG. 2 is a schematic cross-sectional view of a device including a housing having a large interval with respect to a mounting surface on which the gas sensor module according to the first embodiment is mounted.
Figure 3:
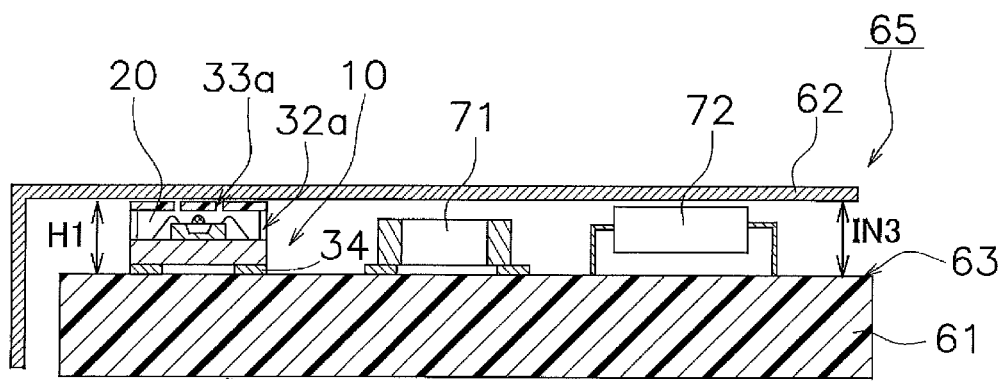
FIG. 3 is a schematic cross-sectional view of a device including a housing having a small interval with respect to the mounting surface on which the gas sensor module according to the first embodiment is mounted.

The cross-sectional shape of a device 60 in which the gas sensor module 10 is mounted is illustrated in FIG. 2. The device 60 includes a printed-wiring board 61 and a housing 62. Small solid devices 71, 72 and the gas sensor module 10 are mounted on the printed-wiring board 61. In other words, the printed-wiring board 61 is an example of a mounting place for the gas sensor module 10. The small solid devices may include, for example, a chip resistor, a chip condenser, an integrated circuit, a wireless module, a MEMS device, and the like. The solid devices 71, 72 and the gas sensor module 10 are mounted on the printed-wiring board 61, for example, by soldering.

An interval IN1 between a mounting surface 63 of the printed-wiring board 61 of the device 60 and the housing 62 is designed such that an interval IN2 sufficient for gas to flow remains between an upper surface of the cover 33 of the gas sensor module 10 and the housing 62 even when a height H1 of the gas sensor module 10 from the mounting surface 63 is subtracted from the interval IN1. In such a case, a specific type of gas to be detected can be introduced through the openings 33a of the cover 33 of the gas sensor module 10 and the openings 32a of the side wall 32 into the detection space S1. Meanwhile, a device 65 illustrated in FIG. 3 has an interval IN3 between the mounting surface 63 of the printed-wiring board 61 and the housing 62, and the interval IN3 is substantially the same as the height H1 of the gas sensor module 10 from the mounting surface 63. Therefore, the openings 33a of the cover 33 are highly likely to be closed by the housing 62 in the device 65. Even when the gas sensor module 10 is mounted in the device 65, the device 65 is configured such that a specific type of gas can be introduced through the openings 32a of the side wall 32 into the detection space S1.

(3) Concrete Configuration of Gas Sensor Module

Figure 4:
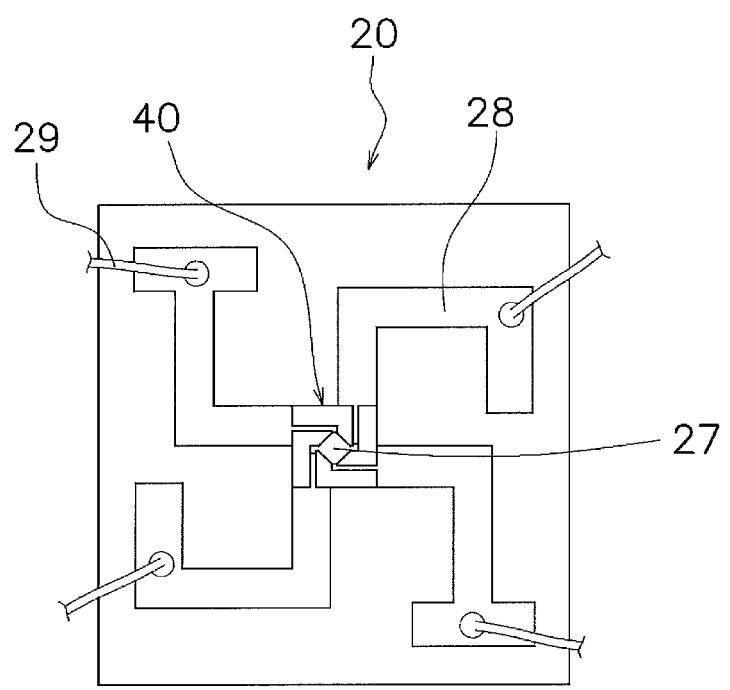
FIG. 4 is a plan view of a semiconductor chip in the gas sensor module.

FIG. 4 illustrates an enlarged view of the semiconductor chip 20 of the gas sensor module 10. A plurality of semiconductor chips 20 are formed on a semiconductor wafer 100 illustrated in FIG. 7 described below. For example, a silicon wafer is applied as the semiconductor wafer 100. The semiconductor chip 20 has a rectangular shape, one side of which is, for example, 2 mm or less. The gas sensor element 40 is formed in a center portion of the semiconductor chip 20. The gas sensor element 40 is configured such that a length in a planar direction is, for example, 0.1 mm or less. An electrode wiring pattern 28 extends from the gas sensor element 40 toward end portions of the semiconductor chip 20. The wires 29 are bonded to the electrode wiring pattern 28. The electrode wiring pattern 28 of the semiconductor chip 20 and the terminals 34 are electrically connected by the wires 29.

Figure 5:
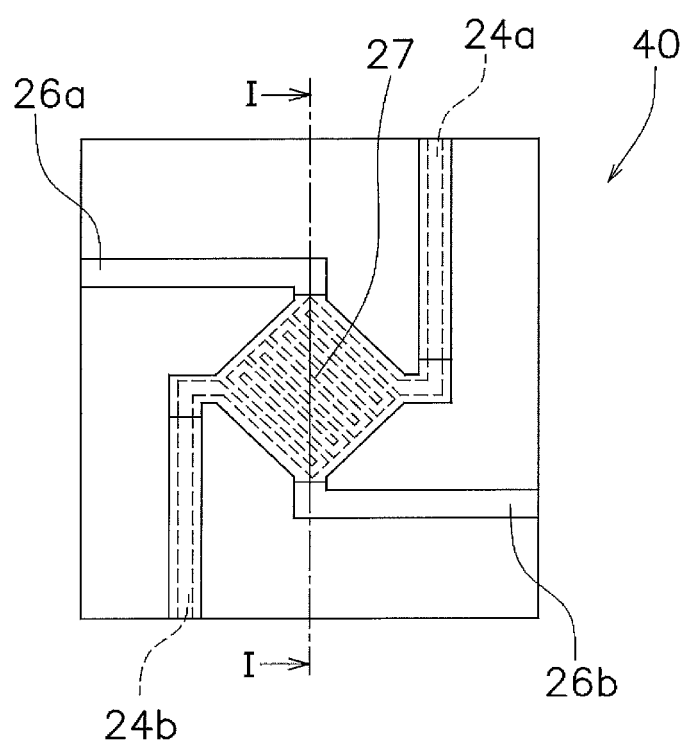
FIG. 5 is a plan view of a gas sensor element formed on the semiconductor chip.
Figure 6:
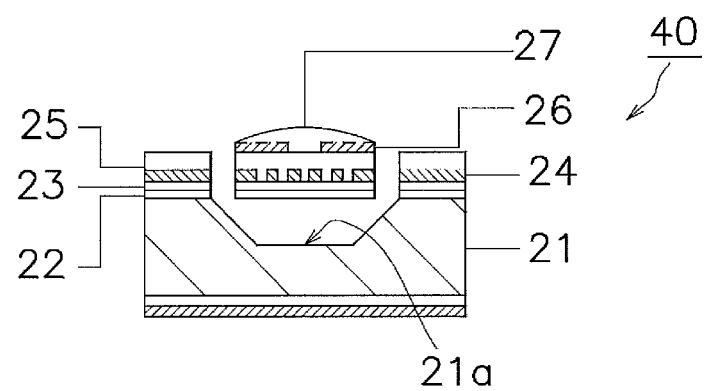
FIG. 6 is a cross-sectional view of the gas sensor element taken along the line I-I of FIG. 5.
Figure 7:
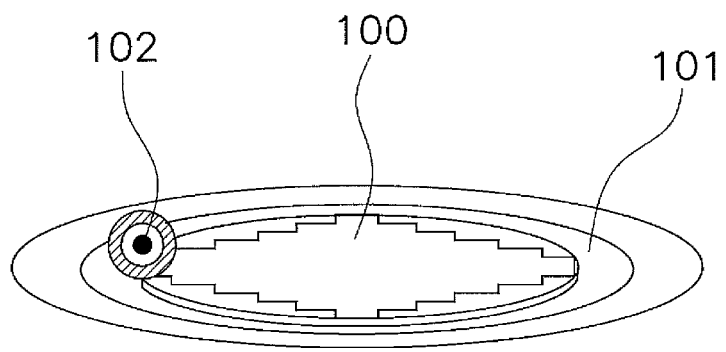
FIG. 7 is a schematic perspective view illustrating dicing of a semiconductor wafer.

FIG. 5 illustrates an enlarged view of a portion of the gas sensor element 40, and FIG. 6 illustrates a cross-sectional view taken along the line I-I of FIG. 5. A cavity 21a is formed in a base 21 made of silicon. The cavity 21a includes an opening in a surface of the base 21. For example, the semiconductor wafer 100 is etched to form the cavity 21a. An oxide film 22 is formed on the surface of the base 21. In a case where the base 21 is made of silicon, the oxide film 22 is a silicon oxide film. An insulating film 23 is formed on the oxide film 22. A heater electrode 24 is formed on the insulating film 23. Electricity can be applied to the heater electrode 24 to heat a gas sensing member 27. To heat the gas sensing member 27, a direct-current voltage is applied to heater electrodes 24a, 24b of FIG. 5. An insulating film 25 is formed on the heater electrode 24. Sensor electrodes 26a, 26b and the gas sensing member 27 are formed on the insulating film 25, and the sensor electrodes 26a, 26b are electrically connected via the gas sensing member 27. When the gas sensing member 27 is exposed to a specific type of gas, the resistance value of the gas sensing member 27 changes and a resistance value between the sensor electrodes 26a, 26b varies. In addition, the sensor electrodes 26a, 26b are included in a sensor electrode 26 illustrated in FIG. 6.

(4) Method of Manufacturing Gas Sensor Module

A method of manufacturing the gas sensor module 10 according to the first embodiment will be described by using FIGS. 7 to 16. A plurality of semiconductor chips 20 illustrated in FIG. 4 are formed on the semiconductor wafer 100 illustrated in FIG. 7. The semiconductor wafer 100 is attached to a dicing tape 101. The semiconductor wafer 100 is diced by a blade 102 when being attached to the dicing tape 101 to cut out the plurality of semiconductor chips 20 from the semiconductor wafer 100.

Figure 8:
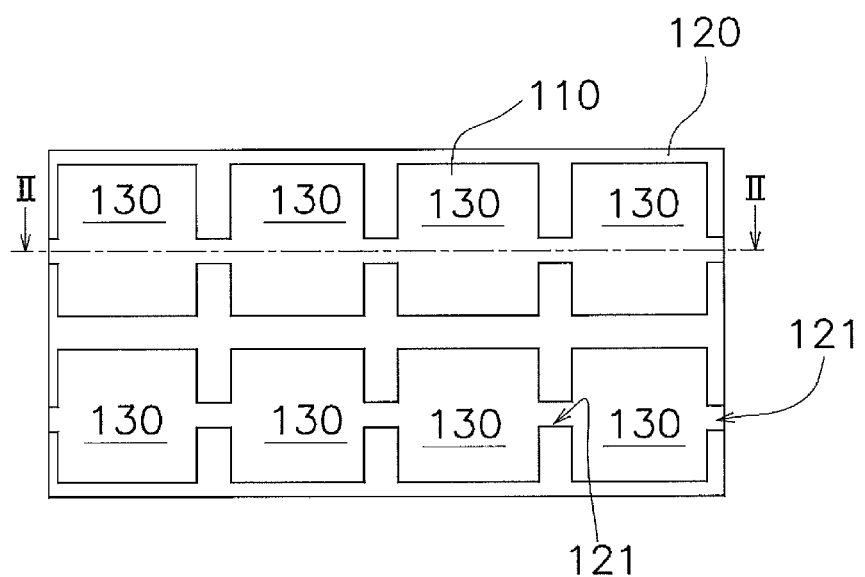
FIG. 8 is a plan view of a collective substrate on which a side wall forming member is injection-molded.
Figure 9:
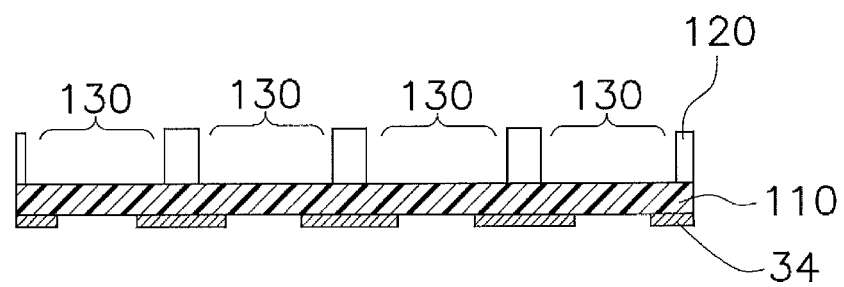
FIG. 9 is a cross-sectional view of the collective substrate taken along the line II-II of FIG. 8.
Figure 10:
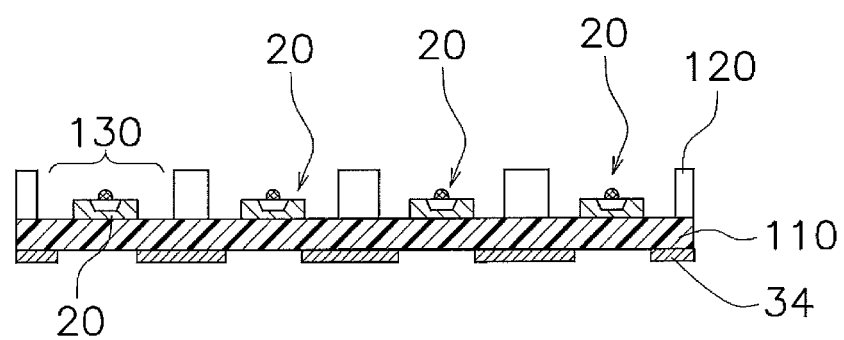
FIG. 10 is a schematic cross-sectional view illustrating a state where the semiconductor chips are die-bonded on the collective substrate.
Figure 11:
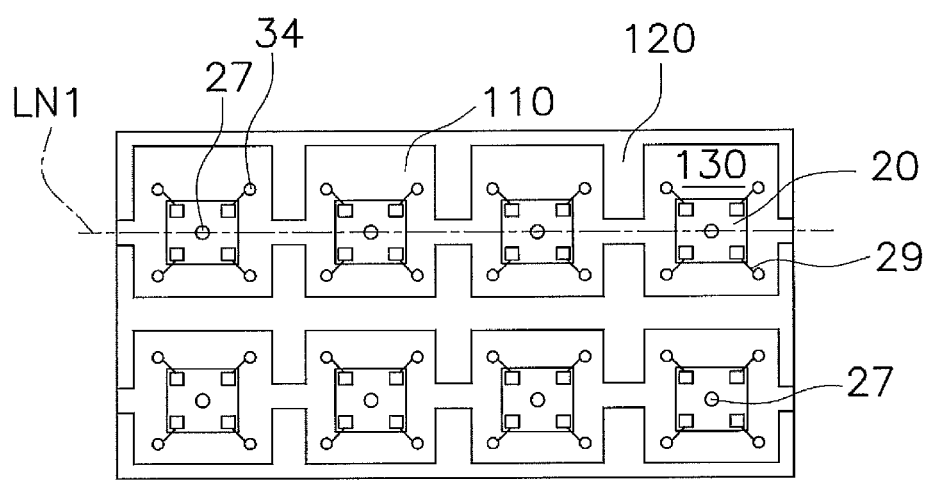
FIG. 11 is a schematic plan view of the wire-bonded collective substrate.

Concurrently with the preparation of the plurality of semiconductor chips 20, a side wall forming member 120 is formed on a collective substrate 110 illustrated in FIGS. 8 and 9. FIG. 9 is a cross-sectional view taking along the line II-II of FIG. 8. For example, a Flame Retardant Type 4 (FR4) formed by impregnating glass fiber cloth with epoxy resin and hardening the cloth; or a GPY material formed by impregnating glass fiber cloth with polyimide resin or modified polyimide resin is applicable as a major material for the collective substrate 110. The side wall forming member 120 is integrally formed on the collective substrate 110, for example, by injection molding. For example, epoxy resin (including fillers), liquid crystal polymer, phenol resin, or polyester is applicable to the side wall forming member 120. A plurality of chip arrangement spaces 130 surrounded by the side wall forming member 120 are formed. Two dents 121 are formed in each of the chip arrangement spaces 130 on the side wall forming member 120. In addition, a portion extending to the collective substrate 110 is also referred to as a dent in the specification. As illustrated in FIG. 10, a single semiconductor chip 20 is assigned to each of the chip arrangement spaces 130 or a predetermined number of semiconductor chips 20 are assigned to each of the chip arrangement spaces 130, and then the semiconductor chips 20 are die-bonded to the collective substrate 110. As illustrated in FIG. 11, a position to which the semiconductor chips 20 are to be attached is provided, for example, on a straight line LN1 in which the dents 121 are connected via the gas sensing members 27.

Figure 12:
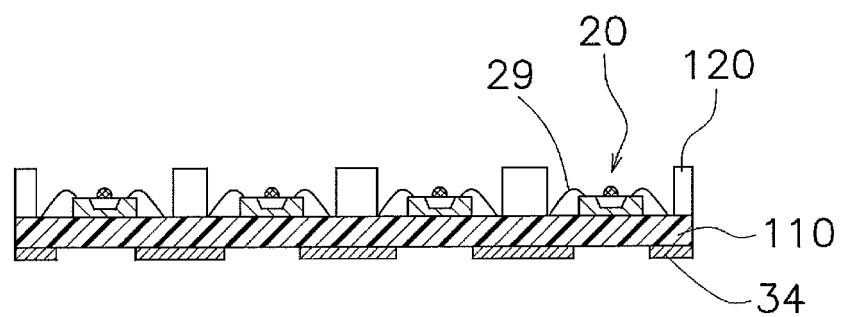
FIG. 12 is a schematic cross-sectional view of the wire-bonded collective substrate.

As illustrated in FIGS. 11 and 12, wire bonding of each of the semiconductor chips 20 allows the wires 29 to be connected to the terminals 34 of the collective substrate 110 and to the semiconductor chip 20. Thus, the terminals 34 are partly exposed to the chip arrangement space 130 on the collective substrate 110.

Figure 13:
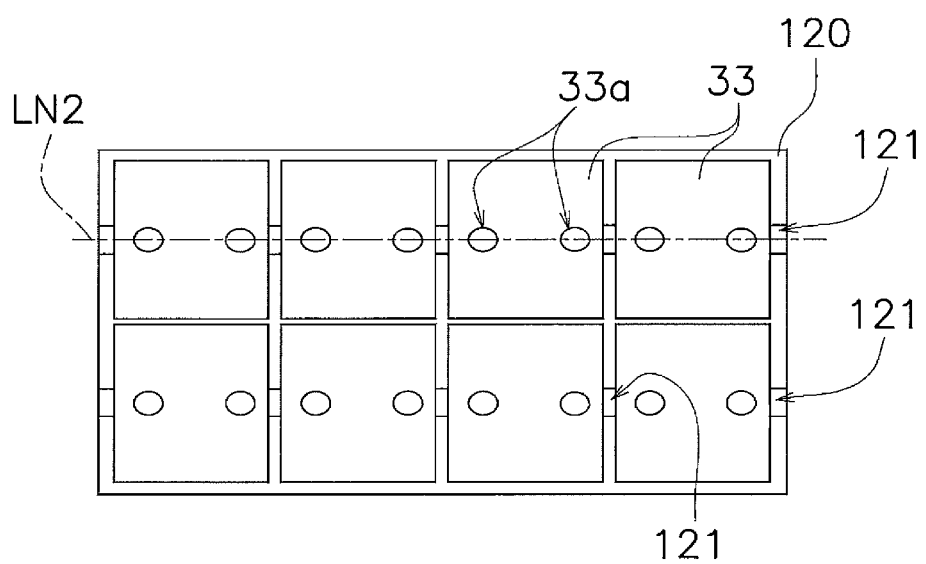
FIG. 13 is a plan view for explaining an assembly process of firmly attaching a cover to the side wall forming member.
Figure 14:
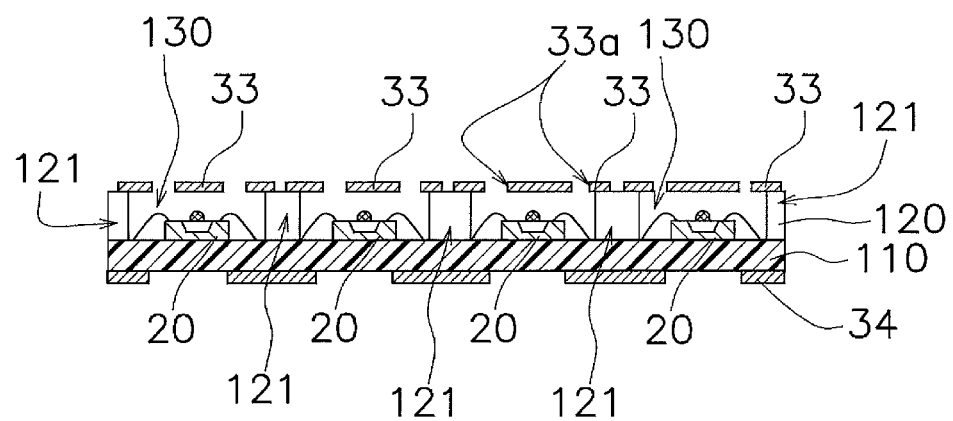
FIG. 14 is a schematic cross-sectional view for explaining the assembly process of firmly attaching the cover to the side wall forming member.

As illustrated in FIGS. 13 and 14, a plurality of the covers 33 are bonded to the side wall forming member 120, and the gas sensor modules 10 are assembled. The chip arrangement spaces 130 are covered by the covers 33, thus forming the detection spaces S1 of the gas sensor module 10. The two openings 33a are formed in each of the covers 33. The gas sensing member 27 is arranged under a straight line LN2 connecting the two openings 33a. The covers 33 arranged side by side to each other are bonded with an adhesive applied to an upper surface of the side wall forming member 120 such that an interval is formed between the covers 33. At the time of applying the adhesive to the upper surface of the side wall forming member 120, the adhesive is applied so as not to close the dents 121. For example, the adhesive is applied only to the upper surface of the side wall forming member 120 by screen printing in a state where the dents 121 are avoided. Thus, the chip arrangement spaces 130 are covered by the covers 33, and the gas sensor module 10 is assembled. For example, metal, ceramic or glass is applicable to the covers 33. Metals to be applied to the covers 33 may include, for example, kovar, stainless, and nickel.

Figure 15:
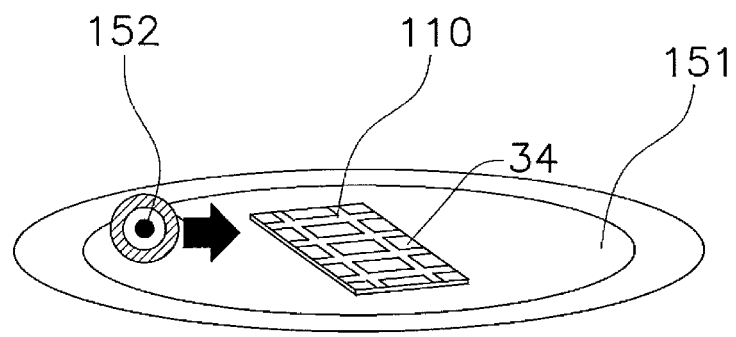
FIG. 15 is a schematic perspective view illustrating package dicing.
Figure 16:
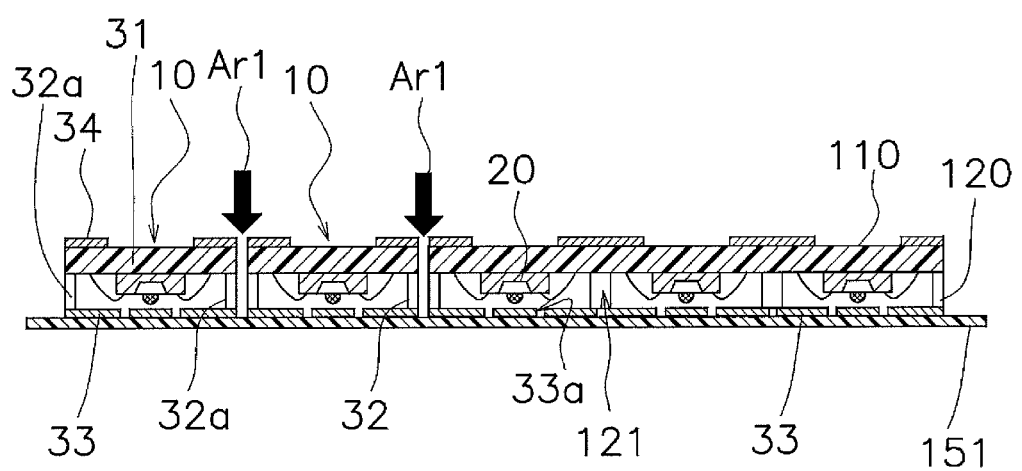
FIG. 16 is a schematic cross-sectional view of the collective substrate for explaining package dicing.

After the covers 33 are bonded to the side wall forming member 120, a dicing tape 151 is attached to the covers 33 as illustrated in FIGS. 15 and 16. Then, the gas sensor modules 10 formed on the single collective substrate 110 are separated by package dicing using a blade 152. The locations indicated by arrows Ar1 in FIG. 16 are cut portions. At this time, the terminals 34 are also cut away by the blade 152. Note that in the example described, the terminals 34 are cut away by the blade 152. Alternatively, the terminals 34 may be initially formed separately on the respective gas sensor modules 10, and a manufacturing method in which the terminals 34 are not cut away by the blade 152 can be provided. In this package dicing, the side wall forming member 120 and the collective substrate 110 are diced together with the dicing tape 151 by the blade 152 such that the two dents 121 become the openings 32a that communicate with the chip arrangement space 130. The center portion of the side wall forming member 120 is cut by the blade 152 in a direction in which the side wall forming member 120 extends. At the time of dicing, cooling water is poured on the blade 152. However, the openings 33a of the cover 33 corresponding to the bottom at the time of dicing are closed by the dicing tape 151. Thus, the cooling water is unlikely to flow into the chip arrangement space 130. After dicing, the gas sensor modules 10 are dried.

(5) Modified Examples (5-1) Modified Example 1A

Figure 17A:
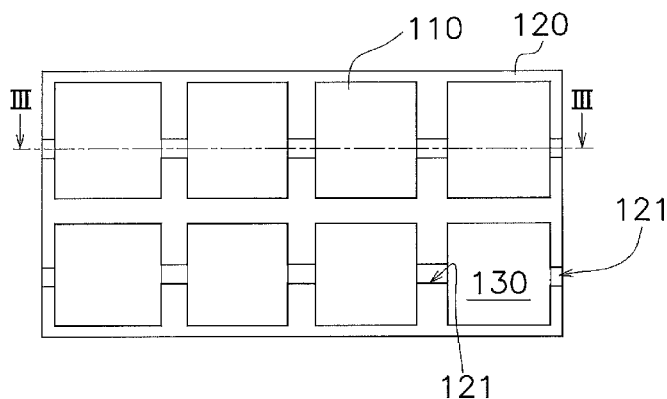
FIG. 17A is a plan view illustrating a state where the side wall forming member is formed on the collective substrate in a manufacturing method according to a modified example 1A.
Figure 17B:
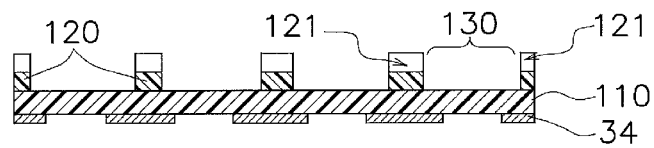
FIG. 17B is a cross-sectional view of the collective substrate taken along the line III-III of FIG. 17A.
Figure 17C:
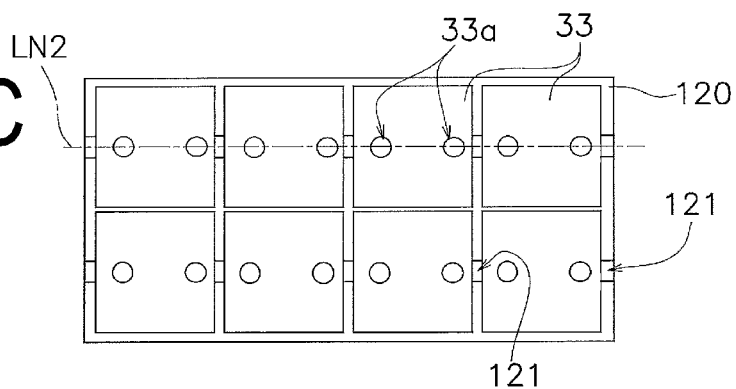
FIG. 17C is a plan view for explaining the assembly process of firmly attaching the cover to the side wall forming member.
Figure 17D:
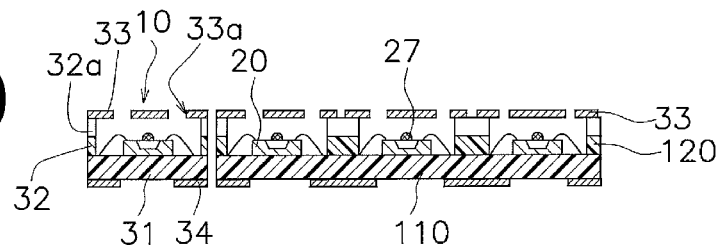
FIG. 17D is a schematic cross-sectional view of the collective substrate for explaining package dicing.

In the method of manufacturing the gas sensor module 10 according to the first embodiment, the dent 121 formed in the side wall forming member 120 extend to the collective substrate 110. However, each of the dents 121 may be formed to have a short depth as illustrated in FIGS. 17A and 17B. The cross-section of the collective substrate 110 taken along the line III-III of FIG. 17A is illustrated in FIG. 17B. As illustrated in FIG. 17C, after die bonding and wire bonding, the covers 33 are bonded to the side wall forming member 120. Thereafter, package dicing is performed as illustrated in FIG. 17D, and the gas sensor module 10 described in the modified example 1A can be obtained. Since the depth of the dent 121 is short, the openings 32a of the side wall 32 are arranged above the substrate 31. In addition, the same reference numbers are assigned to the same portions as those of the first embodiment.

(5-2) Modified Example 1B

Figure 18A:
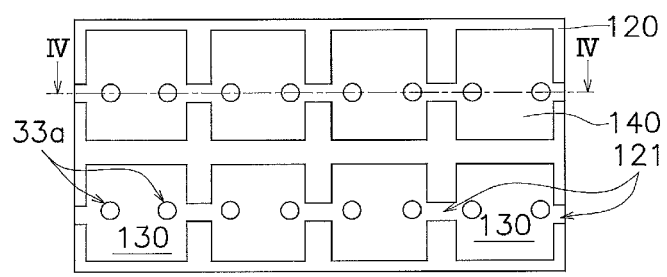
FIG. 18A is a plan view illustrating a state where the side wall forming member is formed on the collective substrate in a manufacturing method according to a modified example 1B.
Figure 18B:
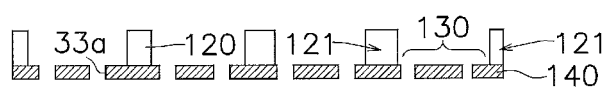
FIG. 18B is a cross-sectional view of the collective substrate taken along the line IV-IV of FIG. 18A.
Figure 18C:
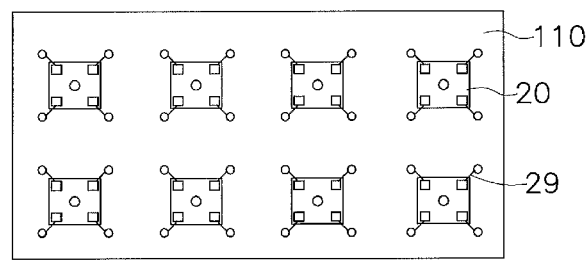
FIG. 18C is a schematic plan view illustrating a state where the semiconductor chips are die-bonded on the collective substrate.
Figure 18D:
FIG. 18D is a schematic cross-sectional view illustrating the die-bonded state.
Figure 18E:
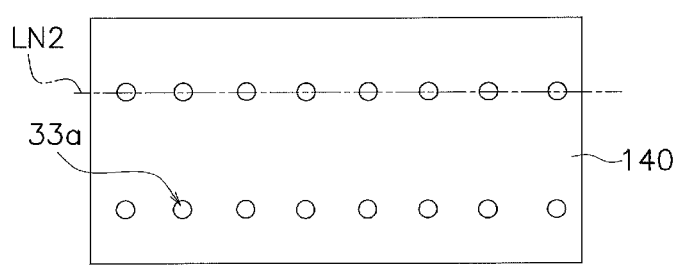
FIG. 18E is a plan view illustrating the cover firmly attached to the side wall forming member.
Figure 18F:
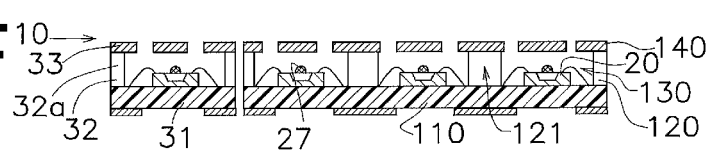
FIG. 18F is a schematic cross-sectional view of the collective substrate for explaining package dicing.

A case where the side wall forming member 120 is formed on the collective substrate 110 is described in the method of manufacturing the gas sensor module 10 according to the first embodiment and the modified example 1A. Alternatively, for example, the side wall forming member 120 may be formed on a cover forming member 140 as illustrated in FIGS. 18A and 18B. The cross-section of the cover forming member 140 taken along the line IV-IV of FIG. 18A is illustrated in FIG. 18B. The side wall forming member 120 is integrally formed with the cover forming member 140, for example, by insert molding. The side wall forming member 120 is configured such that the two dents 121 are formed in each of the chip arrangement spaces 130. In addition, the cover forming member 140 is configured such that the two openings 33a are formed for each of the chip arrangement spaces 130. As illustrated in FIGS. 18C and 18D, the semiconductor chips 20 are attached to the collective substrate 110 by die bonding and wire bonding. In addition, as illustrated in FIGS. 18E and 18F, the semiconductor chips 20 are arranged in the chip arrangement spaces 130, and the cover forming member 140 and the side wall forming member 120 are bonded to the collective substrate 110. At this time, an adhesive is applied so as not to enter into the dents 121 in the same way as the method of manufacturing the gas sensor module 10 according to the first embodiment. In the same way as in the modified example 1A, the cover forming member 140 is disposed to cover the collective substrate 110 such that the gas sensing members 27 are arranged under the straight line LN2 passing through the openings 33a and dents 121. In a case of a modified example 1B as illustrated in FIG. 18F, when package dicing is performed, not only are the collective substrate 110 and the side wall forming member 120 cut by the blade 152 as in the first embodiment, but also the cover forming member 140 is cut by the blade 152.

(5-3) Modified Example 1C

Figure 19A:
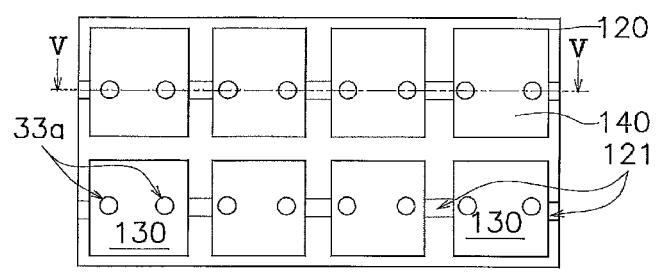
FIG. 19A is a plan view illustrating a state where the side wall forming member is formed on the collective substrate in a manufacturing method according to a modified example 1C.
Figure 19B:
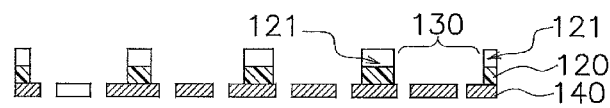
FIG. 19B is a cross-sectional view of the collective substrate taken along the line V-V of FIG. 19A.
Figure 19C:
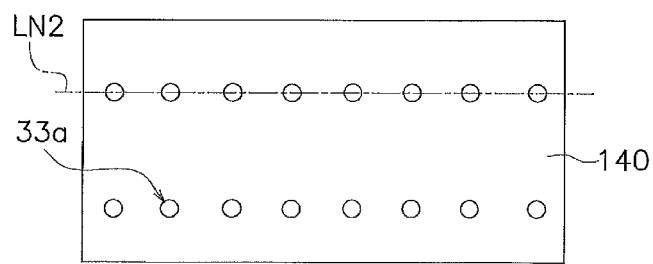
FIG. 19C is a plan view of the cover firmly attached to the side wall forming member.
Figure 19D:
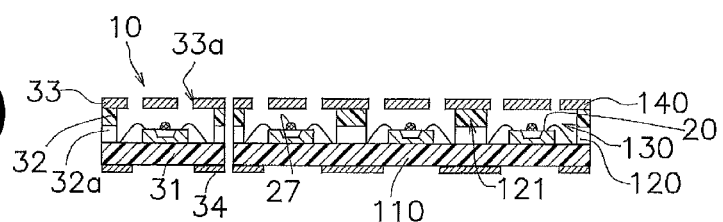
FIG. 19D is a schematic cross-sectional view of the collective substrate for explaining package dicing.

In the same way as the relation between the gas sensor module 10 according to the first embodiment and the gas sensor module 10 according to the modified example 1A, the gas sensor module 10 according to a modified example 1C may be formed such that the dent 121 has a short depth compared with the gas sensor module 10 according to the modified example 1B. FIGS. 19A and 19B illustrate the dent 121 having the depth shorter than the depth of the dent 121 illustrated in FIGS. 18A and 18B. The cross-section of the cover forming member 140 taken along the line V-V of FIG. 19A is illustrated in FIG. 19B. As illustrated in FIGS. 19C and 19D, the gas sensor module 10 according to the modified example 1C is configured such that the opening 32a of the side wall 32 is formed so as to extend to the substrate 31 but so as not to extend to the cover 33.

(5-4) Modified Example 1D

The gas sensor module 10 according to the first embodiment is configured such that the openings 33a are formed not only in the side wall 32 but also in the cover 33. Alternatively, the gas sensor module according to an embodiment of the present technology may be configured such that the openings 32a are formed only in the side wall 32.

(5-5) Modified Example 1E

A case where the gas sensor module 10 is configured such that a specific type of gas is detected by the gas sensing member 27 is described in the first embodiment; however, the gas sensor module according to the present technology is not limited to the configuration in which a specific type of gas is detected. The present technology may be applied, for example, to a gas sensor module including the gas sensor element 40 configured to detect the flow rate of gas.

(5-6) Modified Example 1F

A case where the covers 33 are bonded to the side wall forming member 120 is described in the first embodiment. Alternatively, instead of bonding the covers 33, a single cover forming member 140 (on which the side wall forming member 120 is not insert-molded) having the size to cover the chip arrangement spaces 130 illustrated in FIG. 18A or FIG. 19A may be applied.

(5-7) Modified Example 1G

The dents 121 have the same height in the first embodiment and the modified examples. Alternatively, the dents 121 may have different heights, and the openings 32a formed in the side wall 32 of the gas sensor module 10 may have different heights. By making the openings 32a having the different heights, an ascending air current generated by heating the gas sensing member 27 allows gas to be discharged mainly from one of the openings 32a which has the height higher than that of the other of the openings 32a and to be suctioned mainly from the other of the openings 32a which has the height lower than that of one of the openings 32a. Consequently, the gas can be replaced with fresh gas.

Second Embodiment

A gas sensor module according to a second embodiment of the present technology will be described by using FIGS. 20 to 25.

(6) Configuration of Gas Sensor Module

Figure 20:
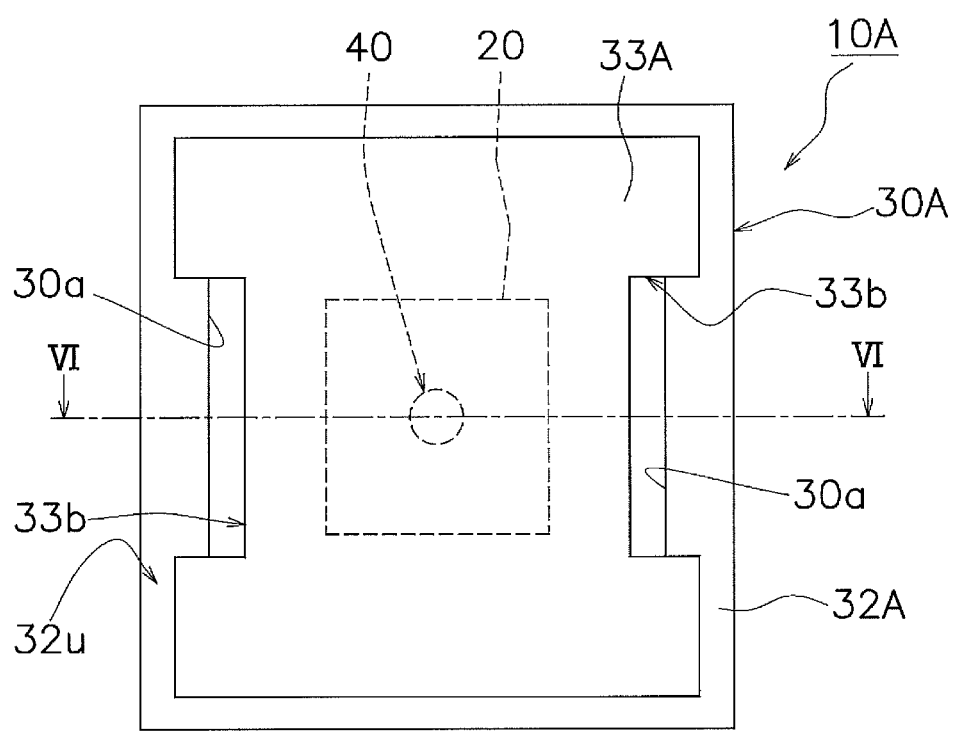
FIG. 20 is a plan view of a gas sensor module according to a second embodiment.
Figure 21:
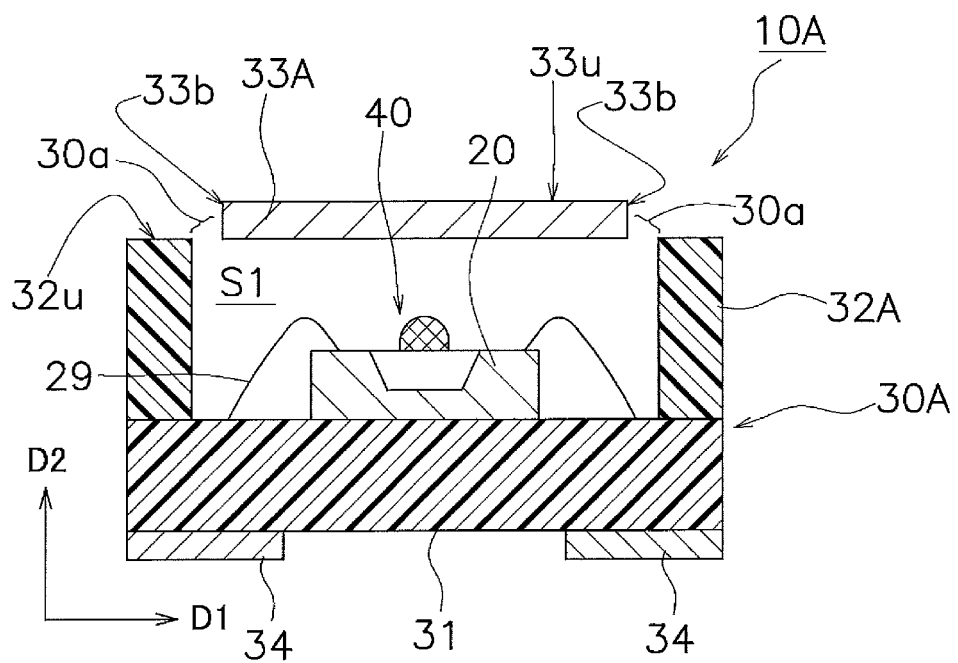
FIG. 21 is a schematic cross-sectional view of the gas sensor module taken along the line VI-VI of FIG. 20.

The planar shape of a gas sensor module 10A according to the second embodiment is schematically illustrated in FIG. 20, and the shape of the end surface as viewed in a cross-section taken along the line VI-VI of FIG. 20 is illustrated in FIG. 21. The gas sensor module 10A according to the second embodiment includes the semiconductor chip 20 and a package 30A.

In the same way as the gas sensor module 10 according to the first embodiment, the gas sensor element 40 is formed on the semiconductor chip 20 of the gas sensor module 10A according to the second embodiment.

The package 30A includes the substrate 31, a side wall 32A, and a cover 33A. The side wall 32A is firmly attached to the substrate 31. The side wall 32A of the second embodiment is different from the side wall 32 of the first embodiment in that openings are not formed in the side wall 32A as the openings 32a are formed in the side wall 32. In addition, openings are not formed in the cover 33A of the second embodiment while the openings 33a are formed in the cover 33 of the first embodiment. Two recessed portions 33b are formed in the cover 33A. The cover 33A includes portions disposed inward of the side wall 32A when being bonded to the side wall 32A, thus forming openings 30a between the side wall 32A and the cover 33A. The portions disposed inward of the side wall are the recessed portions 33b of the gas sensor module 10A illustrated in FIGS. 20 and 21.

According to the second embodiment, the side wall 32A is firmly attached to the substrate 31 and the cover 33A is firmly attached to the side wall 32A in the same manner as the side wall 32 is firmly attached to the substrate 31 and the cover 33 is firmly attached to the side wall 32 in the first embodiment. Also, the semiconductor chip 20 is connected via the bonded wires 29 to the terminals 34.

In the same way as for the package 30, the package 30A is formed in a flattened shape such that a length in the horizontal direction D1 to the semiconductor chip 20 is larger than a length in the orthogonal direction D2 to the semiconductor chip 20. In addition, to introduce gas into the detection space S1 inside the package 30A and the surrounding area of the semiconductor chip 20, the two openings 30a of the gas sensor module 10A communicate with the outside of the package 30A and with the detection space S1 so as to establish a connection between the outside of the package 30A and the detection space S1.

(7) Type of Use of Gas Sensor Module

Figure 22:
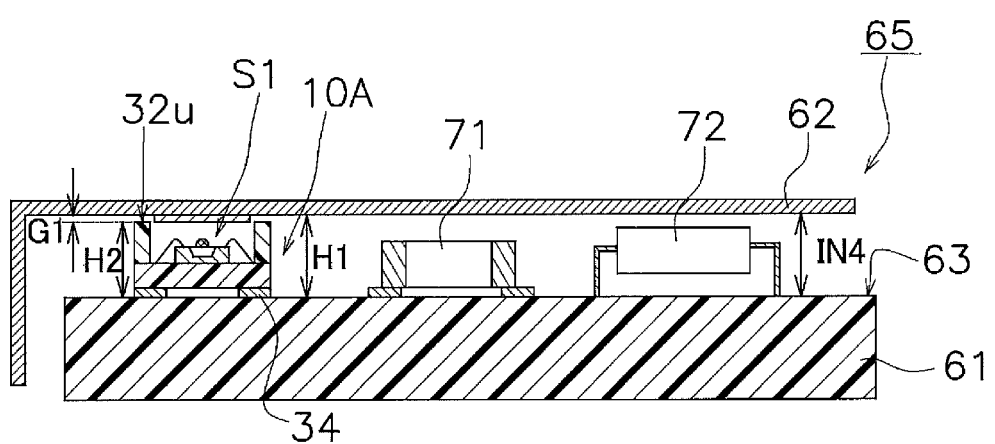
FIG. 22 is a schematic cross-sectional view of a device including the housing having a small interval with respect to the mounting surface on which the gas sensor module according to the second embodiment is mounted.

The cross-sectional shape of the device 65 in which the gas sensor module 10A is mounted is illustrated in FIG. 22. An interval IN4 between the mounting surface 63 of the printed-wiring board 61 of the device 65 illustrated in FIG. 22 and the housing 62 is substantially equal to the height H1 of the gas sensor module 10A from the mounting surface 63. A height H2 from the mounting surface 63 of the printed-wiring board 61 to an upper surface 32u of the side wall 32A is smaller than the height H1 of the gas sensor module 10A. That is, H1 is larger than H2 (H1>H2). A gap G1 is formed between the housing 62 and the upper surface 32u of the side wall 32A by a difference between the height H1 and the height H2 (H1-H2); thus, a passage through which gas flows is secured. Even when the interval IN4 between the mounting surface 63 of the printed-wiring board 61 and the housing 62 is substantially equal to the height H1 of the gas sensor module 10A from the mounting surface 63, the gap G1 as a gas passage is provided. Thus, gas from the outside can be introduced through the openings 30a into the detection space S1. The size of each of the openings 30a is such that, for example, the length of one side in the horizontal direction D1 is smaller than the length of one side of the gas sensor module 10A and that the length of the other side is from 0.1 mm to 0.4 mm. The area of each of the openings 30a is, for example, from 0.01 mm$^2$ to 2 mm$^2$.

A step between the upper surface 32u (see FIG. 21) of the side wall 32A and an upper surface 33u of the cover 33A is preferably larger to secure the gap G1 for introducing the gas from the outside through the opening 30a into the detection space S1. Preferably, the size of the step is, for example, 0.01 mm or greater. In addition, in order to ensure a proper air flow, the size of the step between the side wall 32A and the cover 33A is preferably 0.025 mm or greater. In the second embodiment, the size of the step between the side wall 32A and the cover 33A is substantially equal to the thickness of the cover 33A.

(8) Method of Manufacturing Gas Sensor Module

A method of manufacturing the gas sensor module 10A according to the second embodiment will be described by using FIGS. 23 and 24. A process up to the covers 33A being bonded to a side wall forming member 125 illustrated in FIG. 23 can be performed in the same way as the gas sensor module 10 according to the first embodiment. Accordingly, the following package dicing process will be described. In addition, the side wall forming member 125 may be made of the same material as the side wall forming member 120, and the cover 33A may be made of the same material as the cover 33.

Figure 24:
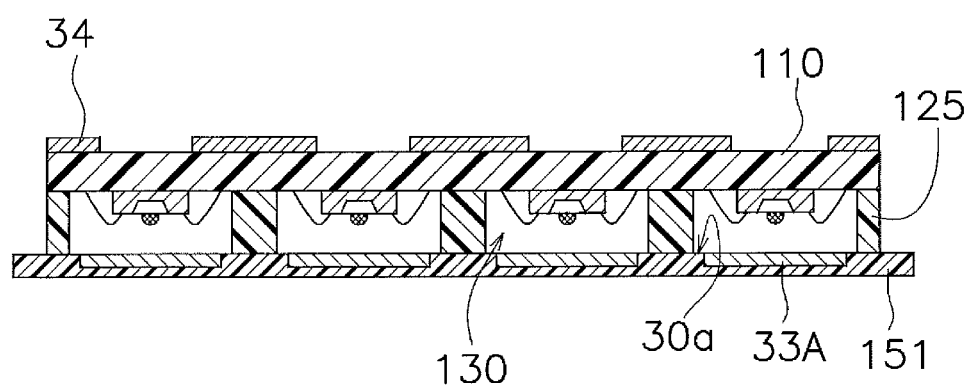
FIG. 24 is a schematic cross-sectional view illustrating a dicing tape applied to the covers.

In package dicing, before cutting with the blade 152 (see FIG. 15), the dicing tape 151 is attached to the covers 33A and the side wall forming member 125 as illustrated in FIG. 24. In order to close the openings 30a with the dicing tape 151, the step between the side wall forming member 125 (the side wall 32A) and the cover 33A is preferably smaller, and the size is preferably, for example, 2 mm or less. Further, in order to close the openings 30a and avoid the tape from easily removed, the size of the step is preferably 0.5 mm or less.

In this package dicing, the side wall forming member 125 and the collective substrate 110 are diced together with the dicing tape 151 by the blade 152. The center portion of the side wall forming member 125 is cut by the blade 152 in a direction in which the side wall forming member 125 extends. At the time of dicing, cooling water is poured on the blade 152. However, the openings 33a of the cover 33A corresponding to the bottom at the time of dicing are closed by the dicing tape 151. Therefore, the cooling water can be avoided from flowing into the chip arrangement space 130. After dicing, the gas sensor modules 10A are dried.

(9) Modified Examples (9-1) Modified Example 2A

Figure 25A:
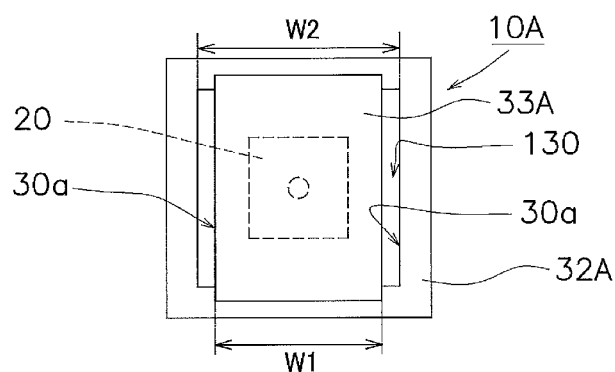
FIG. 25A is a plan view illustrating an example of the gas sensor module according to a modified example 2A.
Figure 25B:
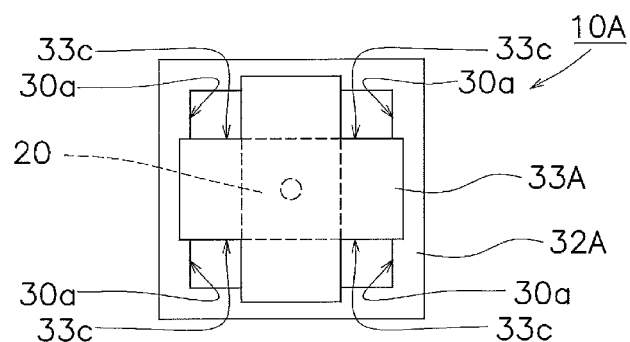
FIG. 25B is a plan view illustrating another example of the gas sensor module according to the modified example 2A.
Figure 25C:
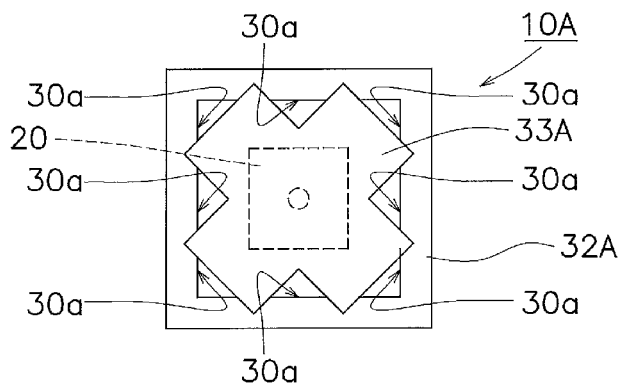
FIG. 25C is a plan view illustrating still another example of the gas sensor module according to the modified example 2A.

In the foregoing second embodiment, a case where the opening 30a is formed by the recessed portion 33b is described. Alternatively, the opening 30a may be formed in a different shape other than the recessed portion 33b. As illustrated in FIG. 25A, for example, the cover 33A has a width W1 smaller than a width W2 of the chip arrangement space 130, and the openings 30a may be formed. Alternatively, as illustrated in FIG. 25B, for example, cut portions 33c are formed at four corners of the cover 33A, and the openings 30a may be formed at the four corners of the cover 33A. Moreover, as illustrated in FIG. 25C, the cover 33A illustrated in FIG. 25B is rotated by 45 degrees and overlapped with the side wall 32A, and the openings 30a may be formed.

(9-2) Modified Example 2B

In the forgoing second embodiment and the foregoing modified example 2A, openings are not formed in the side wall 32A. Alternatively, in the gas sensor module 10A according to the second embodiment and the modified example 2A, a dent is formed in the side wall forming member 125 in the same way as in the first embodiment, yet openings may be formed in the side wall 32A.

(9-3) Modified Example 2C

In the forgoing second embodiment and the foregoing modified examples 2A, 2B, openings are not formed in the cover 33A. Alternatively, for the gas sensor module 10A according to the second embodiment and the modified examples 2A, 2B, the same openings as the openings 33a described in the first embodiment may be further formed in the cover 33A.

(9-4) Modified Example 2D

In the method of manufacturing the gas sensor module 10A according to the second embodiment, a case where the covers 33A are bonded to the side wall forming member 125 is described. However, the method of manufacturing the gas sensor module 10A according to the second embodiment may be performed in a different manner other than bonding the covers 33A one by one. As described in the modified examples 1B, 1C, openings are formed in a cover forming member in advance and arranged such that the openings are overlapped with the side wall forming member 125. Thereafter, the cover forming member and the side wall forming member 125 may be cut by a blade so as to form the openings 30a.

(9-5) Modified Example 2E

A case where the gas sensor module 10A is configured such that a specific type of gas is detected by the gas sensing member 27 is described in the second embodiment; however, the gas sensor module according to the present technology is not limited to a gas sensor module configured to detect a specific type of gas. The present technology may be applied, for example, to a gas sensor module including the gas sensor element 40 configured to detect the flow rate of gas.

Third Embodiment

A gas sensor module according to a third embodiment of the present technology will be described by using FIGS. 26 to 29.

(10) Configuration of Gas Sensor Module

Figure 26:
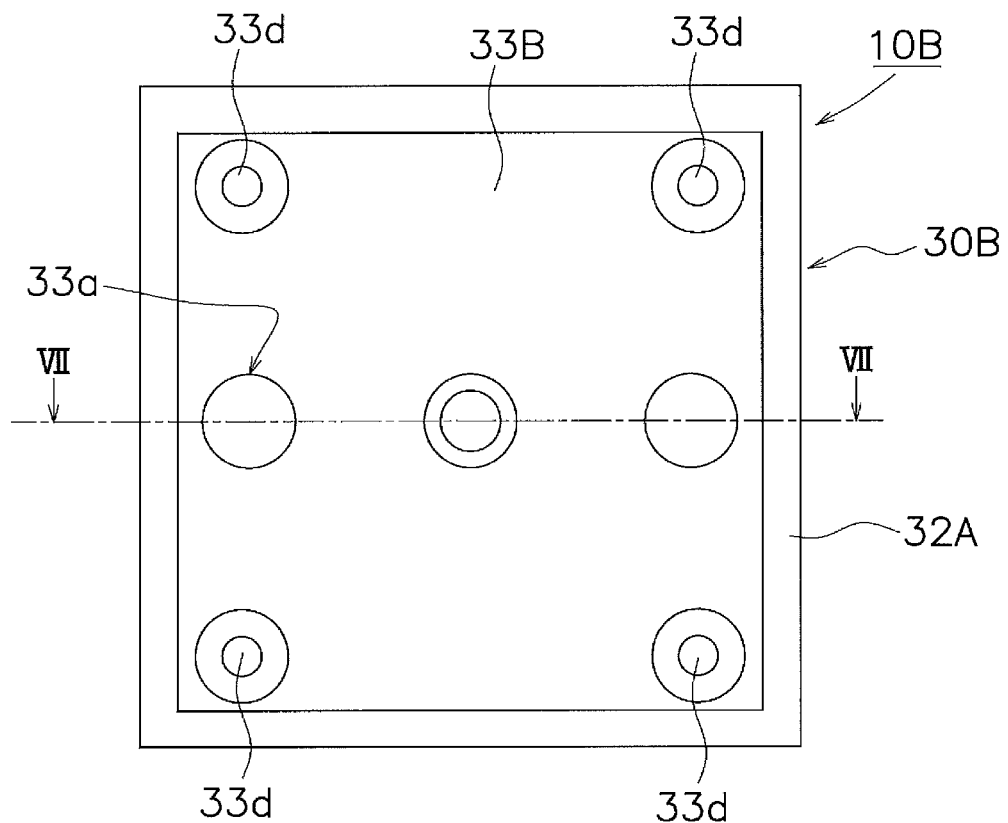
FIG. 26 is a plan view of a gas sensor module according to a third embodiment.
Figure 27:
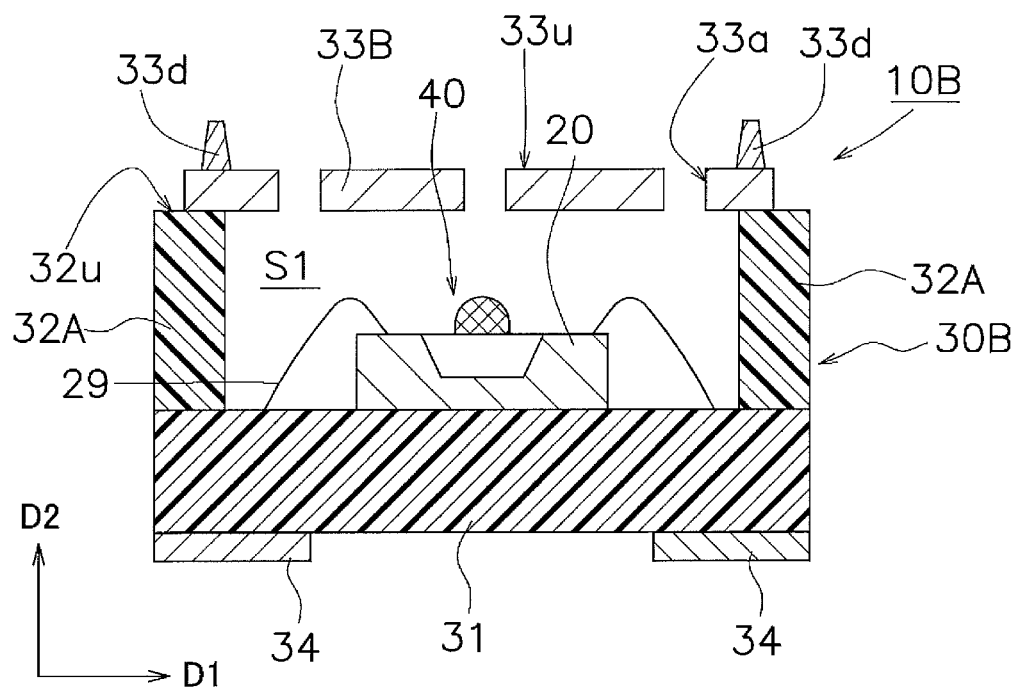
FIG. 27 is a schematic cross-sectional view of the gas sensor module taken along the line VII-VII of FIG. 26.

The planar shape of a gas sensor module 10B according to the third embodiment is schematically illustrated in FIG. 26, and the cross-sectional shape taken along the line VII-VII of FIG. 26 is illustrated in FIG. 27. The gas sensor module 10B according to the third embodiment includes the semiconductor chip 20 and a package 30B.

In the same way as the gas sensor module 10 according to the first embodiment, the gas sensor element 40 is formed on the semiconductor chip 20 of the gas sensor module 10B according to the third embodiment.

The package 30B includes the substrate 31, the side wall 32A, and a cover 33B. The side wall 32A is firmly attached to the substrate 31. The side wall 32A of the third embodiment is the same as the side wall 32A of the second embodiment. The three openings 33a are formed in the cover 33B of the third embodiment. Further, protrusions 33d are respectively formed at four corners on an upper surface of the cover 33B. In addition, the cover 33B may be made of the same material as the cover 33.

According to the third embodiment, the side wall 32A is firmly attached to the substrate 31 and the cover 33B is firmly attached to the side wall 32A in the same manner as the side wall 32 is firmly attached to the substrate 31 and the cover 33 is firmly attached to the side wall 32 in the first embodiment. Also, the semiconductor chip 20 is connected via the bonded wires 29 to the terminals 34.

In the same way as the package 30, the package 30B is formed in a flattened shape such that a length in the horizontal direction D1 to the semiconductor chip 20 is larger than a length in the orthogonal direction D2 to the semiconductor chip 20.

(11) Type of Use of Gas Sensor Module

Figure 28:
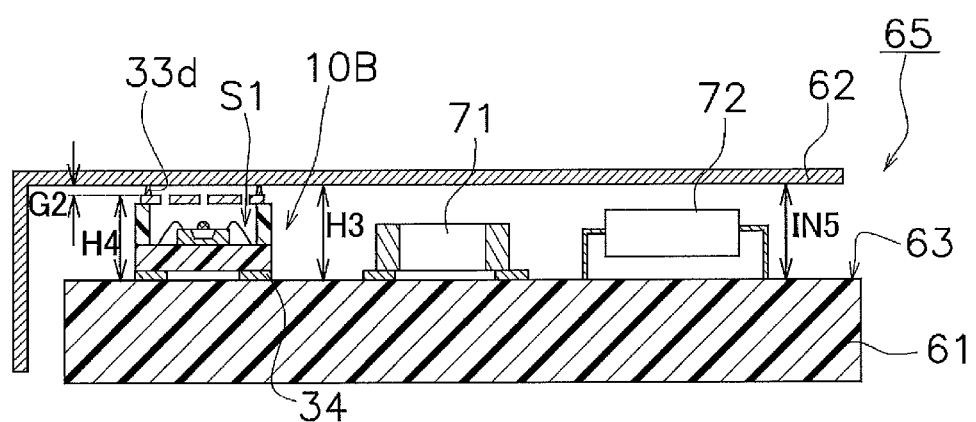
FIG. 28 is a schematic cross-sectional view of the device including the housing having a small interval with respect to the mounting surface on which the gas sensor module according to the third embodiment is mounted.

The cross-sectional shape of the device 65 in which the gas sensor module 10B is mounted is illustrated in FIG. 28. An interval IN5 between the mounting surface 63 of the printed-wiring board 61 of the device 65 illustrated in FIG. 28 and the housing 62 is substantially equal to a height H3 of the gas sensor module 10B from the mounting surface 63. However, a height H4 from the mounting surface 63 of the printed-wiring board 61 to the upper surface 32u (see FIG. 27) of the cover 33B is smaller than the height H3 of the gas sensor module 10B. That is, H3 is larger than H4 (H3>H4). A gap G2 is formed between the housing 62 and the upper surface 33u of the side wall 32A (see FIG. 27) by a difference between the height H3 and the height H4 (H3-H4); thus, a passage through which gas flows is secured. Even when the interval IN5 between the mounting surface 63 of the printed-wiring board 61 and the housing 62 is substantially equal to the height H3 of the gas sensor module 10B from the mounting surface 63, the gap G2 as a gas passage is provided. Thus, gas from the outside can be introduced through the openings 33a into the detection space S1. The area of each of the openings 33a is, for example, from 0.01 mm$^2$ to 0.2 mm$^2$.

The height of the protrusion 33d is preferably larger to secure the gap G2 for introducing the gas from the outside through the openings 33a into the detection space S1. Preferably, the height is, for example, 0.01 mm or greater. In addition, in order to ensure proper air flow, the height of the protrusion 33d is preferably 0.025 mm or greater.

(12) Method of Manufacturing Gas Sensor Module

Figure 29:
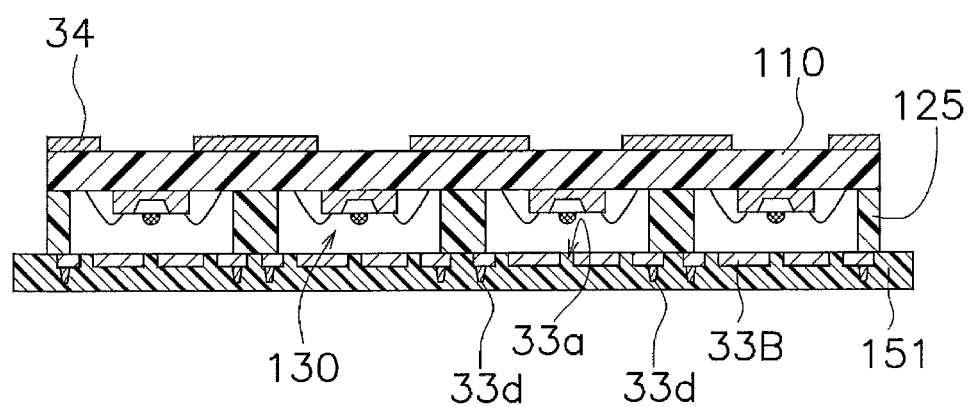
FIG. 29 is a schematic cross-sectional view illustrating the dicing tape applied to covers.

A method of manufacturing the gas sensor module 10B according to the third embodiment will be described by using FIG. 29. A process up to the covers 33B being bonded to the side wall forming member 125 illustrated in FIG. 29 can be performed in the same way as the gas sensor module 10 according to the first embodiment. Accordingly, the following package dicing process will be described. In package dicing, before cutting with the blade 152 (see FIG.

15), the dicing tape 151 is attached to the covers 33B. In order to close the openings 33a by the dicing tape 151, the protrusion 33d is preferably shorter, and the height is preferably, for example, 2 mm or less. Further, in order to close the openings 33a and avoid the tape from easily removed, the height of the protrusion 33d is preferably 0.5 mm or less.

In this package dicing, the side wall forming member 125 and the collective substrate 110 are diced together with the dicing tape 151 by the blade 152. The center portion of the side wall forming member 125 is cut by the blade 152 in a direction in which the side wall forming member 125 extends. At the time of dicing, cooling water is poured on the blade 152. However, the openings 33a of the cover 33B corresponding to the bottom at the time of dicing are closed by the dicing tape 151. Thus, the cooling water can be avoided from flowing into the chip arrangement space 130. After dicing, the gas sensor modules 10B are dried.

(13) Modified Examples (13-1) Modified Example 3A

In the third embodiment, openings are not formed in the side wall 32A. In the same way as in the first embodiment, dents are formed in the side wall forming member 125 in the gas sensor module 10B according to the third embodiment, yet openings may be formed in the side wall of the gas sensor module 10B.

Alternatively, without forming openings in the cover 33B, instead of forming the openings 33a in the cover 33B, openings as described in the first embodiment may be formed in the side wall 32A. Even when the gas sensor module 10B configured as just described is surrounded by electric parts or the like, gas is easily guided to the openings of the side wall through the gap G2 formed by the protrusions 33d.

(13-2) Modified Example 3B

In the third embodiment, openings are not formed between the side wall 32A and the cover 33B. For the gas sensor module 10B according to the third embodiment and the modified example 3A, openings as described in the second embodiment may be further formed between the side wall 32A and the cover 33B.

Alternatively, without forming openings in the cover 33B, instead of forming the openings 33a in the cover 33B, openings as described in the second embodiment may be formed between the side wall 32A and the cover 33B. In this case, in addition to the thickness of the cover 33B, the height of the protrusion 33d enables to secure a passage of gas; thus, the gas is easily guided compared to the gas sensor module 10A according to the second embodiment.

(13-3) Modified Example 3C

For the gas sensor module 10B including the protrusions 33d according to the third embodiment, the openings 32a described in the first embodiment and the openings 30a described in the second embodiment may be further formed.

(13-4) Modified Example 3D

A case where the gas sensor module 10B is configured such that a specific type of gas is detected by the gas sensing member 27 is described in the third embodiment; however, the gas sensor module according to the present technology is not limited to a gas sensor module configured to detect a specific type of gas. The present technology may be applied, for example, to a gas sensor module including the gas sensor element 40 configured to detect the flow rate of gas.

(14) Features (14-1)

The package 30 of the gas sensor module 10 according to the first embodiment and the package 30B of the gas sensor module 10B according to the modified example 3A are configured such that the openings 32a that communicate with the detection space S1 are formed in the side wall 32. Further, the package 30A of the gas sensor module 10A according to the second embodiment and the package 30B of the gas sensor module 10B described in the modified example 3B are configured such that the openings 30a that communicate with the detection space S1 are formed between the side wall 32A and the cover 33A. Furthermore, the package 30A of the gas sensor module 10A described in the modified example 2B is configured such that the openings 32a that communicate with the detection space S1 are formed between the side wall 32, 32A and the cover 33A. The package 30B of the gas sensor module 10B described in the modified example 3C is configured such that the openings 32a, 30a that communicate with the detection space S1 are formed between the side wall 32A and the cover 33A.

At least one of the openings 30a, 32a that communicate with the detection space S1 allows gas from the outside to flow into the detection space S1, and the rest of the openings 30a, 32a allow the gas to be discharged. In addition, the openings 30a, 32a are not closed by the housing 62 even when the housing 62 is brought into contact with the upper surface of the gas sensor module 10, 10A, 10B. Therefore, even when the foregoing gas sensor module 10, 10A, 10B is attached in a mounting space having a short length in a direction orthogonal to the semiconductor chip 20, the gas sensor module 10, 10A, 10B can easily detect gas.

(14-2)

As described in the second embodiment, the modified example 2B, the modified example 3B, and the modified example 3C, in the gas sensor module 10A, 10B including the openings 30a that communicate with the detection space S1, the openings formed at least between the side wall 32A and the cover 33A, 33B, the thickness of the cover 33A, 33B is preferably from 0.01 mm to 2 mm. The thickness of the cover 33A, 33B is 0.01 mm or greater; therefore, even when the gas sensor module 10A, 10B is mounted in a narrow space in which the housing 62 is in contact with the upper surface of the cover 33A, 33B, gas can be guided through the openings 30a to the detection space S1. In addition, the thickness of the cover 33A, 33B is 2 mm or less; thus, at the time of package dicing, the dicing tape 151 is attached and foreign substances can be prevented from entering through the openings 30a together with cooling water or the like. As a result, the gas sensor module 10A, 10B is configured to increase the certainty of gas introduction into the detection space S1 and improve quality when being mounted in a mounting space having a short length in a direction orthogonal to the semiconductor chip 20.

(14-3)

The package 30B of the gas sensor module 10B according to the third embodiment and the modified examples 3A to 3C includes the openings 33a formed in the cover 33B that communicate with the detection space S1, and the protrusions 33d configured to form a passage for introducing gas to the openings 33a.

At least one of the openings 33a that communicate with the detection space S1 allows gas from the outside to flow into the detection space S1 and the rest of the openings 33a allow the gas to be discharged. In addition, the protrusions 33d are provided; therefore, even when the housing 62 is brought into contact with an upper portion of the gas sensor module 10B, the openings 33a are not closed by the housing 62. Consequently, even when being attached in a mounting space having a short length in a direction orthogonal to the semiconductor chip 20, the foregoing gas sensor module 10B can easily detect gas.

(14-4)

As described in the third embodiment and the modified examples 3A to 3C, in the gas sensor module 10B including the openings 33a that communicate with the detection space S1, the openings formed in the cover 33B, the height of each of the protrusions 33d formed on the upper surface of the cover 33B is preferably from 0.01 mm to 2 mm. The height of the protrusion 33d is 0.01 mm or greater; thus, even when the gas sensor module 10B is mounted in a narrow space in which the housing 62 is in contact with an upper portion of the cover 33B, gas can be guided through the openings 33a to the detection space S1. In addition, the height of the protrusion 33d is 2 mm or less; thus, at the time of package dicing, the dicing tape is attached and foreign substances can be prevented from entering through the openings 30a together with cooling water or the like. As a result, the gas sensor module 10B is configured to increase the certainty of gas introduction into the detection space S1 and improve quality when being mounted in a mounting space having a short length in a direction orthogonal to the semiconductor chip 20.

(14-5)

In the method of manufacturing the gas sensor module 10 according to the first embodiment, as described using FIGS. 8 and 9 or FIGS. 17A and 17B, the side wall forming member 120 including the dents 121 for the single chip arrangement space 130 is formed by injection molding on the single collective substrate 110 so as to surround the chip arrangement spaces 130. As described by using FIGS. 11 and 12, the semiconductor chips 20 on which the gas sensor elements 40 are formed are fixed by die bonding in areas of the collective substrate 110, which correspond to the chip arrangement spaces 130, and are electrically connected by wire bonding via the wires 29 to the terminals 34 of the collective substrate 110. As described by using FIGS. 13 and 14 or FIGS. 17C and 17D, the covers 33 are bonded to the side wall forming member 120 so that the chip arrangement spaces 130 are covered by the covers 33, thus assembling the gas sensor modules 10. Then, at least the side wall forming member 120 and the collective substrate 110 are diced so that the dents 121 become the openings 32a that communicate with the chip arrangement space 130; thus, the gas sensor modules 10 formed on the single collective substrate 110 are separated.

Also, in the method of manufacturing the gas sensor module 10 according to the modified examples 1B, 1C of the first embodiment, as described by using FIGS. 18A and 18B or FIGS. 19A and 19B, the single cover forming member 140 is formed by injection molding such that the side wall forming member 120 including the dents 121 for the single chip arrangement space 130 is arranged to surround the chip arrangement spaces 130. As described by using FIGS. 18C and 18D, the semiconductor chips 20 on which the gas sensor elements 40 are respectively formed are fixed by die bonding in areas of the collective substrate 110, which correspond to the chip arrangement spaces 130, and are electrically connected by wire bonding via the wires 29 to the terminals 34 of the collective substrate 110. As described by using FIGS. 18E and 18F or FIGS. 19C and 19D, the side wall forming member 120 is bonded to the collective substrate 110, thus assembling the gas sensor modules 10. Then, at least the collective substrate 110, the side wall forming member 120, and the cover forming member 140 are diced so that the dents 121 become the openings 32a that communicate with the chip arrangement space 130; thus, the gas sensor modules 10 formed on the single collective substrate 110 are separated.

In addition, materials other than water may be used as coolant.

In the method of manufacturing the gas sensor module 10 according to the first embodiment or the modified examples 1B, 1C, the dents 121 are formed in the side wall forming member 120 by injection molding. Thus, even when the gas sensor module 10 is configured such that a length in a direction orthogonal to the semiconductor chip 20 is, for example, 3 mm or less, the openings 32a can be easily formed in the side wall 32.

(14-6)

In the method of manufacturing the gas sensor module 10A according to the second embodiment and the modified examples 2B to 2D, as described by using FIGS. 8 and 9, FIGS. 17A and 17B, and FIGS. 18A and 18B, or FIGS. 19A and 19B, the side wall forming member 120 surrounding the chip arrangement spaces 130 is formed by injection molding on the single collective substrate 110 or the single cover forming member 140. As described by using FIGS. 11 and 12 or FIGS. 18C and 18D, the semiconductor chips 20 on which the gas sensor elements 40 are formed are fixed by die bonding in areas of the collective substrate 110, which correspond to the chip arrangement spaces 130, and are electrically connected by wire bonding via the wires 29 to the terminals 34 of the collective substrate 110.

Figure 23:
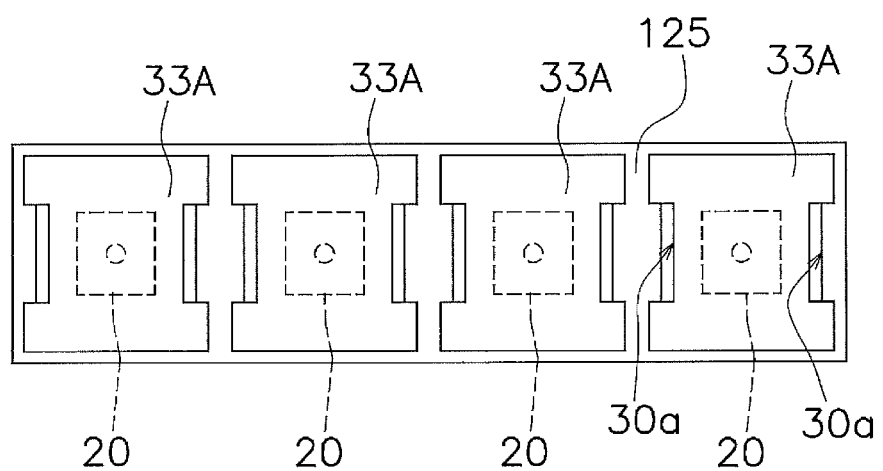
FIG. 23 is a plan view illustrating a state where covers are firmly attached to a side wall forming member.

As illustrated in FIGS. 23 and 24, the side wall forming member 125 is bonded such that the openings 30a that communicate with the chip arrangement space 130 are formed between the covers 33A for the chip arrangement spaces 130 and the side wall forming member 125, thus assembling the gas sensor modules 10A. Then, the dicing tape 151 is attached so as to close the openings 30a. In a case where the side wall forming member 125 is formed on the collective substrate 110, the side wall forming member 125 and the collective substrate 110 are diced by the dicing blade 152 while coolant is being poured on the dicing blade 152. Also, in a case where the side wall forming member 125 is formed on the cover forming member 140, the collective substrate 110; the side wall forming member 125; and the cover forming member 140 are diced by the dicing blade 152 while coolant is being poured on the dicing blade 152. Thus, the gas sensor modules 10A formed on the single collective substrate 110 are separated.

In addition, materials other than water may be used as coolant.

In the method of manufacturing the gas sensor module 10A according to the second embodiment, a gap is formed between the side wall forming member 125 and the cover 33A. Thus, even when the gas sensor module 10 is configured such that a length in a direction orthogonal to the semiconductor chip 20 is, for example, 3 mm or less, the openings 30a can be easily formed between the side wall 32A and the cover 33A.

In addition, the coolant can be prevented by the dicing tape 151 from entering the chip arrangement space 130.

The invention claimed is:

1. A gas sensor module, comprising:
a semiconductor chip on which a gas sensor element is formed; and
a package with a flattened shape including a substrate to which the semiconductor chip is electrically connected and fixed, a side wall firmly attached to the substrate, and a cover firmly attached to the side wall, the package including a detection space in which gas flows around the semiconductor chip, the package having a length in a direction parallel to the semiconductor chip larger than a length in a direction orthogonal to the semiconductor chip; wherein
the package includes a plurality of openings formed in the side wall and/or between the side wall and the cover that communicate with the detection space.

2. The gas sensor module according to claim 1, wherein the package includes a plurality of openings formed at least between the side wall and the cover that communicate with the detection space, and the cover has a thickness of from 0.01 mm to 2 mm.

3. A gas sensor module, comprising:
a semiconductor chip to which a gas sensor element is formed; and
a package with a flattened shape including a substrate on which the semiconductor chip is electrically connected and fixed, a side wall firmly attached to the substrate, and a cover firmly attached to the side wall, the package including a detection space in which gas flows around the semiconductor chip, the package having a length in a direction parallel to the semiconductor chip larger than a length in a direction orthogonal to the semiconductor chip; wherein
the package includes a plurality of openings that communicate with the detection space, the openings formed in the cover, and a protrusion for forming a passage through which gas is guided to the plurality of openings.

4. The gas sensor module according to claim 3, wherein the protrusion of the package has a height of from 0.01 mm to 2 mm.

5. A method of manufacturing a gas sensor module, comprising:
forming a side wall forming member on a collective substrate or a cover forming member by injection molding such that the side wall forming member including a plurality of dents corresponding to a chip arrangement space surrounds a plurality of the chip arrangement spaces;
fixing by die bonding a plurality of semiconductor chips, each of which is provided with a gas sensor element, in a plurality of areas of the collective substrate, which corresponds to the plurality of chip arrangement spaces, and electrically connecting the plurality of semiconductor chips by wire bonding to terminals of the collective substrate;
assembling a gas sensor module by bonding the side wall forming member to the cover, the cover forming member, or the collective substrate; and
separating the gas sensor module formed on the collective substrate by dicing at least the side wall forming member and the collective substrate such that the plurality of dents are formed as openings that communicate with the chip arrangement space.

6. A method of manufacturing a gas sensor module according to claim 5, further comprising;
forming a side wall forming member by injection molding on a collective substrate or a cover forming member such that the side wall forming member surrounds a plurality of chip arrangement spaces;
assembling a plurality of gas sensor modules by bonding the side wall forming member such that a plurality of openings that communicate with the plurality of chip arrangement spaces are formed between covers and the side wall forming member, corresponding to the plurality of chip arrangement spaces;
attaching a dicing tape to close the plurality of openings; and
separating the plurality of gas sensor modules formed on the collective substrate by pouring coolant on a dicing blade while dicing at least the side wall forming member and the collective substrate by the dicing blade.

* * * * *